United States Patent
Sun et al.

(10) Patent No.: US 9,640,411 B2
(45) Date of Patent: May 2, 2017

(54) METHOD FOR MANUFACTURING A TRANSISTOR DEVICE COMPRISING A GERMANIUM CHANNEL MATERIAL ON A SILICON BASED SUBSTRATE, AND ASSOCIATED TRANSISTOR DEVICE

(71) Applicant: IMEC VZW, Leuven (BE)

(72) Inventors: Jianwu Sun, ShaanXi (CN); Roger Loo, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/934,111

(22) Filed: Nov. 5, 2015

(65) Prior Publication Data

US 2016/0126109 A1  May 5, 2016

(30) Foreign Application Priority Data

Nov. 5, 2014  (EP) .................................... 14191938

(51) Int. Cl.
*H01L 29/06* (2006.01)
*H01L 21/3205* (2006.01)
(Continued)

(52) U.S. Cl.
CPC .. *H01L 21/32055* (2013.01); *H01L 21/02532* (2013.01); *H01L 21/02645* (2013.01);
(Continued)

(58) Field of Classification Search
CPC ....................... H01L 21/32055; H01L 29/1054
(Continued)

(56) References Cited

U.S. PATENT DOCUMENTS 7,977,706 B2  7/2011  Lochtefeld
8,173,551 B2  5/2012  Bai et al.
(Continued)

FOREIGN PATENT DOCUMENTS

EP  2 741 320 A1  6/2014

OTHER PUBLICATIONS

EP European Search Report, European Patent Application No. 14191938.1, dated Apr. 15, 2015.
(Continued)

*Primary Examiner* — Anthony Ho
(74) *Attorney, Agent, or Firm* — McDonnell Boehnen Hulbert & Berghoff LLP (57) ABSTRACT

Method for manufacturing a transistor device comprising a germanium channel material on a silicon based substrate, the method comprising providing a shallow trench isolation (STI) substrate comprising a silicon protrusion embedded in STI dielectric structures, and partially recessing the silicon protrusion in order to provide a trench in between adjacent STI structures, and to provide a V-shaped groove at an upper surface of the recessed protrusion. The method also includes growing a $Si_{1-x}Ge_x$ SRB layer in the trenches, and growing a germanium based channel layer on the $Si_{1-x}Ge_x$ SRB layer. In this example, the $Si_{1-x}Ge_x$ SRB layer comprises a germanium content x that is within the range of 20% to 99%, and the SRB layer has a thickness less than 400 nm. The present disclosure also relates to an associated transistor device.

13 Claims, 9 Drawing Sheets (51) Int. Cl.
*H01L 21/311* (2006.01)
*H01L 29/161* (2006.01)
*H01L 21/02* (2006.01)
*H01L 29/66* (2006.01)
*H01L 29/78* (2006.01)
*H01L 29/10* (2006.01)

(52) U.S. Cl.
CPC .. *H01L 21/02647* (2013.01); *H01L 21/31111* (2013.01); *H01L 29/0649* (2013.01); *H01L 29/1054* (2013.01); *H01L 29/161* (2013.01); *H01L 29/66795* (2013.01); *H01L 29/785* (2013.01)

(58) Field of Classification Search
USPC ........................................................ 257/622
See application file for complete search history.

(56) References Cited

U.S. PATENT DOCUMENTS

| 8,680,576 | B2 | 3/2014 | Ching et al. |
| 2009/0039361 | A1 | 2/2009 | Li et al. |
| 2010/0072515 | A1 | 3/2010 | Park et al. |
| 2012/0094467 | A1 | 4/2012 | Wu et al. |
| 2013/0234147 | A1 | 9/2013 | Wu et al. |
| 2014/0131770 | A1 | 5/2014 | Chen et al. |
| 2014/0151766 | A1 | 6/2014 | Eneman et al. |
| 2014/0217499 | A1 | 8/2014 | Lee et al. |
| 2014/0319462 | A1 | 10/2014 | Huang et al. |
| 2015/0054040 | A1 | 2/2015 | Lee et al. |

OTHER PUBLICATIONS

Collaert, N. et al., "Ultimate Nano-Electronics: New Materials and Device Concepts for Scaling Nano-Electronics Beyond the Si Roadmap", Microeletronic Engineering, vol. 132, 2015, pp. 218-225.

Witters, L. et al., "Strained Germanium Quantum Well pMOS FinFETs Fabricated on In Situ, Phosphorus-Doped SiGe Strain Relaxed Buffer Layers Using a Replacement Fin Process", 2013 IEEE International Electron Devices Meeting, Dec. 1, 2013, pp. 20.4.1-20.4.4.

Fang, Y.Y. et al., " Perfectly Tetragonal, Tensile-Strained Ge on Ge1-ySny Buffered Si(100)", Applied Physics Letters, vol. 90, 2007, pp. 061915-1-061915-3.

Loo, Roger et al., "Strained Ge FinFET Structures Fabricated by Selective Epitaxial Growth", 2014 7th International Silicon-Germanium Technology and Device Meeting, Singapore, Jun. 2-4, 2014, pp. 19-20.

METHOD FOR MANUFACTURING A TRANSISTOR DEVICE COMPRISING A GERMANIUM CHANNEL MATERIAL ON A SILICON BASED SUBSTRATE, AND ASSOCIATED TRANSISTOR DEVICE

CROSS-REFERENCE TO RELATED APPLICATION

The present application is a non-provisional patent application claiming priority to European Patent Application No. 14191938.1 filed Nov. 5, 2014, the contents of which are hereby incorporated by reference.

TECHNICAL FIELD

The present disclosure relates to a method for manufacturing a transistor device comprising a germanium channel material on a silicon based substrate, and to associated transistor devices.

BACKGROUND ART

For the technology beyond the 22-nm node CMOS, the use of compressively strained germanium (Ge) as a channel material attracts much interest for the pMOS FinFET. Although Ge material has a higher intrinsic hole mobility than Si, relaxed Ge channel devices do not outperform strained Si channel p-FINFETs. Strained Ge is crucial to boost channel mobility.

Since the 90-nm technology, embedded SiGe source/drain has been used as a stressor in Si pMOS devices. However, with scaling down to sub-22 nm nodes, much less space will limit the source and drain and this stress technique becomes less efficient.

This resulted in a renewed interest in stress formation in Ge channels by SiGe strain relaxed buffers (SRBs) epitaxially grown on Si. The scheme becomes challenging as downscaling goes together with a reduction in thickness of the shallow trench isolation (STI), which in turn sets a limit on the thickness of the SiGe SRB in the case where the Si in between the STI oxide is recessed and replaced by the SiGe SRB.

When trying to implement compressively strained Ge channels on SiGe strain relaxed buffers, a variety of problems exist for the technology beyond the 22-nm node CMOS.

For instance, fabricating a large relaxation degree (>85%) of strain-relaxed $Si_{1-x}Ge_x$ (for instance with x>0.7) is difficult because the thickness of the shallow trench isolation (STI) sets a limit to the thickness of the $Si_{1-x}Ge_x$ SRB. If the SiGe SRB is not strongly (>85%) or fully relaxed, there is an increased risk for strain relaxation of the strained germanium channel, and for an increased leakage current of the final devices. Moreover, if the SiGe is not sufficiently relaxed, further relaxation might occur during subsequent process steps. This would lead to process unreliability, as there might be a higher wafer-to-wafer variation and the final degree of relaxation might vary as function of device dimensions.

In addition, for future technology nodes, the STI thickness is further reduced, which also reduces the maximal allowable $Si_{1-x}Ge_x$ thickness. This makes the fabrication of SiGe SRBs extremely challenging. Strain relaxation only happens above a certain critical thickness. For a given layer thickness, the driving force for further relaxation reduces with increasing degree of relaxation. In conventional schemes, a high degree of strain relaxation is achieved by making the semiconductor layer sufficiently thick. Techniques to make relative thin strain relaxed buffers, in general rely on the controlled implementation of material imperfections (defects) to initiate strain relaxation. However, the presence of defects needs to be avoided/minimised as it has a detrimental effect on final device performance.

Moreover, initiation of layer relaxation comes together with the formation of misfit dislocations. On (001) surfaces, a misfit dislocation network is formed which extends up to 50 nm above the SiGe-SRB/Si-substrate interface which sets a minimum thickness on the SiGe SRB layer to keep the Ge surface channel out of this defective area. If the SiGe has a 50 nm thick defective layer, it limits the minimum thickness of SiGe to keep the Ge channel out of this defective area. Indeed, if a Ge channel layer is grown on such a defective SiGe buffer, the defects can extend to Ge channel layer and thus relax the Ge layer.

Also, due to the formation of facets (e.g. {111} and/or {311} facets, but not limited thereto) during the selective epitaxial growth, the Ge content is not uniform in $Si_{1-x}Ge_x$ (for instance with x>0.7) SRBs, which results in the non-uniformity of strain distribution in the Ge channel layer. In addition, the top surface of the $Si_{1-x}Ge_x$ (for instance x>0.7) SRB may be rounded and not flat, which would also result in an unwanted rounded surface of Ge channel layer.

It is difficult to grow a fully compressively strained Ge channel layer on top of $Si_{1-x}Ge_x$ SRBs, and there exists a need in industry for such solutions.

SUMMARY OF THE DISCLOSURE

The present disclosure provides a method for manufacturing a transistor device comprising a germanium channel structure on a silicon based substrate, which allows the manufacturing of a fully compressively strained germanium channel structure, having improved channel structure properties, on an underlying layer stack which is limited in thickness.

An associated transistor device is also disclosed.

In a first aspect of the present disclosure, a method for manufacturing a transistor device comprising a germanium channel material on a silicon based substrate is disclosed. The method includes providing an shallow trench isolation (STI) substrate comprising a silicon protrusion embedded in STI dielectric structure; partially recessing the silicon protrusion in order to provide a trench in between adjacent STI structures, and to provide a V-shaped groove at an upper surface of the recessed protrusion; growing a $Si_{1-x}Ge_x$ SRB layer in the trenches; and growing a Germanium based channel layer in the trenches on the $Si_{1-x}Ge_x$ SRB layer (thereby not overgrowing the STI structures which define the trenches). In this aspect, the $Si_{1-x}Ge_x$ SRB layer comprises a germanium content x, x being in the range of 20% to 99% (more preferably in the range of 50% to 84%, more preferably in the range of 65% to 75%; preferably equal to or larger than 70%) and the SRB layer has a thickness in the range of 30 to 400 nm (thickness for instance smaller than 120 nm).

The germanium based channel layer is preferably suitable for being used as a channel structure of channel of a transistor device, e.g. a transistor device of the FINFET type.

It is a further potential advantage that the $Si_{1-x}Ge_x$ SRB grown on a "V"-shape groove has a more uniform Ge content as demonstrated by TEM. This results in a reduced strain variation throughout the SRB layer and a more optimal stress built up in the germanium based/germanium channel layer.

It is a further potential advantage that formation of the {111} surface "V"-shape groove results in a better confinement of the {111} defects in {111} planes closer to the SiGe/Si-substrate interface. The dense defects/dislocation networks in the V shape region enhance the relaxation degree in SiGe SRB layers.

It is a further potential advantage that the surface orientations of SiGe SRB and consequently the strained Ge (sGe) fin surface can be very well controlled, by carefully matching the SiGe thickness and the Si recess depth. By surface orientations, both the {001} top surface as well as the {110} side walls are meant.

In preferred embodiments, the germanium based channel layer comprises more than 95% of germanium or more than 99% of germanium. Preferably, it is a germanium layer. It can be for instance also a SiGeSn layer, wherein preferably the Si and Sn concentration are predetermined such that the SiGeSn layer has the same lattice constant as germanium.

In preferred embodiments, the SRB layer comprises a germanium content x in the range of 20% to 99%, more preferably in the range of 50% to 84%, more preferably in the range of 65% to 75%. The germanium content is preferably smaller than 84%. For higher Ge % levels, there may be an increased risk for leakage currents to occur in the final device.

In preferred embodiments, the $Si_{1-x}Ge_x$ SRB layer has a thickness larger than 30 nm. The SRB layer thickness preferably lies within the range of 30 nm to 400 nm. For instance, the SRB layer thickness can be smaller than 120 nm.

In preferred embodiments, growing the $Si_{1-x}Ge_x$ SRB layer in the trenches comprises epitaxially growing the $Si_{1-x}Ge_x$ SRB layer on the upper surface, for instance on the upper surface of the recessed silicon protrusion.

In preferred embodiments, the method further comprises epitaxially growing a seed layer on the upper surface, and growing the $Si_{1-x}Ge_x$ SRB layer in the trenches comprises epitaxially growing the $Si_{1-x}Ge_x$ SRB layer on the seed layer.

This provides the further potential advantage that the $Si_{1-x}Ge_x$ SRB layer can be even further relaxed and for a suitable thickness of the Ge seed layer, 100% strain relaxation can be achieved. In addition, the full relaxation of the SiGe SRB has been achieved for thicknesses down to 40 nm, which illustrates that the thickness of the SRB layer can be further reduced. The combined thickness of the seed layer and SRB layer can be smaller than the thickness of a similar SRB layer if it were not combined with the growth of a seed layer.

Preferably, the seed layer is germanium based. In preferred embodiments, the seed layer comprises more than 95% of germanium or more than 99% of germanium. Preferably, it is a germanium layer. It can be for instance also a SiGeSn layer, wherein preferably the Si and Sn concentration are predetermined such that the SiGeSn layer has the same lattice constant as germanium.

The seed layer thickness is preferably comprised within the range of 1 nm to 10 nm, more preferably within the range of 1 to 5 nm.

It is a potential advantage that the combination of the seed layer with the V-shape groove still provides a uniform Ge content throughout the SRB layer. Without the V-shape groove, i.e. when the SRB would be deposited on a flat silicon surface, or when the SRB layer would be deposited on a seed layer on a flat silicon surface, a non-uniformity in Ge content would be present.

The combined thickness of seed layer and $Si_{1-x}Ge_x$ SRB layer preferably lies within the range of 30 nm to 400 nm.

In preferred embodiments, the Germanium based channel layer has a thickness of more than 10 nm, or more than 20 nm, or more than 30 nm.

In preferred embodiments, growing a $Si_{1-x}Ge_x$ SRB layer in the trenches and growing a Germanium based channel layer on the $Si_{1-x}Ge_x$ SRB layer, and, in case a seed layer is grown, (first) growing the seed layer, is performed in a continuous, uninterrupted process.

In preferred embodiments, the STI thickness is smaller than 400 nm, more preferably smaller than 200 nm, more preferably smaller than 150 nm, more preferably smaller than 100 nm.

In preferred embodiments, the trench has a width smaller than 20 nm, or smaller than 15 nm, or smaller than 10 nm or smaller than 5 nm. In preferred embodiments, the trench width lies in between 4 nm and 8 nm, when manufacturing in the 10 nm and 7 nm nodes as known in the field. It is an advantage of having a narrow trench width that the growth of a $Si_{1-x}Ge_x$ (e.g. x>0.7) strain relaxed buffer (SRB) on the "V"-shape groove can result in a flat surface of SiGe buffer layer (SRB) and a flat surface of Ge channel layer.

It will be appreciated that for larger trenches, the strained Ge (sGe) fin surface can be less controlled, as has been further explained in the detailed description.

Moreover, it has been shown that the combination of having relatively narrow trenches combined with the "V"-shape groove and seed layer as described above, is beneficial, preferably when epitaxially growing the seed layer on the upper surface, and epitaxially growing the $Si_{1-x}-Ge_x$ SRB layer on the seed layer.

In preferred embodiments, the trench depth is smaller than 200 nm, more preferably smaller than 150 nm, more preferably smaller than 100 nm.

In preferred embodiments, the silicon substrate is a (100) oriented substrate, and the V-shaped groove at an upper surface of the recessed protrusion is defined by {111} oriented facets.

In preferred embodiments, partially recessing the silicon protrusion in order to provide a trench in between adjacent STI structures, and to provide a V-shaped groove at an upper surface of the recessed protrusion, comprises performing etching the protrusions with a wet-chemical etching solution such as but not limited to a tetramethylammonium hydroxide (TMAH) solution, or any other chemical mixture allowing etching of silicon resulting in preferential {111} facet formation.

In preferred embodiments, the maximal trench depth is smaller than the STI thickness.

In preferred embodiments, partially recessing the silicon protrusion in order to provide a trench in between adjacent STI structures, and to provide a V-shaped groove at an upper surface of the recessed protrusion, is performed such that the highest points (at a position adjacent to the sidewalls of the trench) of the {111} oriented facets remains higher than the lower surface of the STI structures.

Indeed, the recess is performed such that undercutting the adjacent STI structures is avoided. The resulting recess does not undercut the adjacent STI structures.

In preferred embodiments, the method further comprises partially recessing the adjacent STI structures after growing the germanium based channel layer in the trenches on the $Si_{1-x}Ge_x$ SRB layer, preferably directly after. Hereby, preferably, the top and side surfaces of the channel layer become exposed. Then, a gate layer or layer stack can be provided over the exposed top surface and side surfaces of the channel layer.

According to preferred embodiments, the method comprises providing source/drain and gate contact structures on the germanium based channel layer.

In a second aspect of the present disclosure, a transistor device comprising a germanium based channel structure on a silicon-based substrate is disclosed, the transistor device comprising a layer stack embedded in STI dielectric structures that is underlying the germanium channel structure. The layer stack includes a recessed silicon protrusion comprising a V-shaped groove at an upper surface thereof, and a $Si_{1-x}Ge_x$ SRB layer above the recessed silicon protrusion. In this aspect, the $Si_{1-x}Ge_x$ SRB layer comprises a germanium content x which is within the range of 20% to 99% (more preferentially in the range of 50% to 84%, more preferentially in the range of 65% to 75%; preferably equal to or larger than 70%), and the SRB layer has a thickness smaller than 400 nm, for instance smaller than 120 nm.

In preferred embodiments, the device further comprises a seed layer, preferably germanium seed layer, in between, preferably directly in between (i.e. there are no other layers in between), the upper surface and the $Si_{1-x}Ge_x$ SRB layer.

In preferred embodiments, the silicon substrate is a (100) oriented substrate, and the V-shaped groove at an upper surface of the recessed protrusion is defined by {111} oriented facets.

In preferred embodiments, the highest points of the {111} oriented facets is higher than the lower surface of the STI structures. Thus, preferably, the {111} oriented facets do not undercut the adjacent STI structures.

In preferred embodiments, the SRB layer has a relaxation degree within the range of 85% to 100% and the germanium based channel structure is fully compressively strained with respect to the SRB layer.

Preferably, the degree of relaxation is within the range of 85 to 90% in the SiGe SRB layer without Ge seed layer, and within the range of 90% to 100%, e.g. 100%, for the SiGe SRB with seed layer.

According to preferred embodiments, the transistor device comprises source/drain and gate contact structures provided on the germanium based channel layer.

Features and advantages disclosed for one of the above aspects of the present invention are hereby also implicitly disclosed the other aspects, mutatis mutandis, as the skilled person will recognize.

Certain objects and advantages of various inventive aspects have been described herein above. It is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE DRAWINGS

The disclosure will be further elucidated by means of the following description and the appended figures.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the various embodiments, although referred to as "preferred" are to be construed as example manners in which the disclosure may be implemented rather than as limiting the scope of the disclosure.

Figure 1:
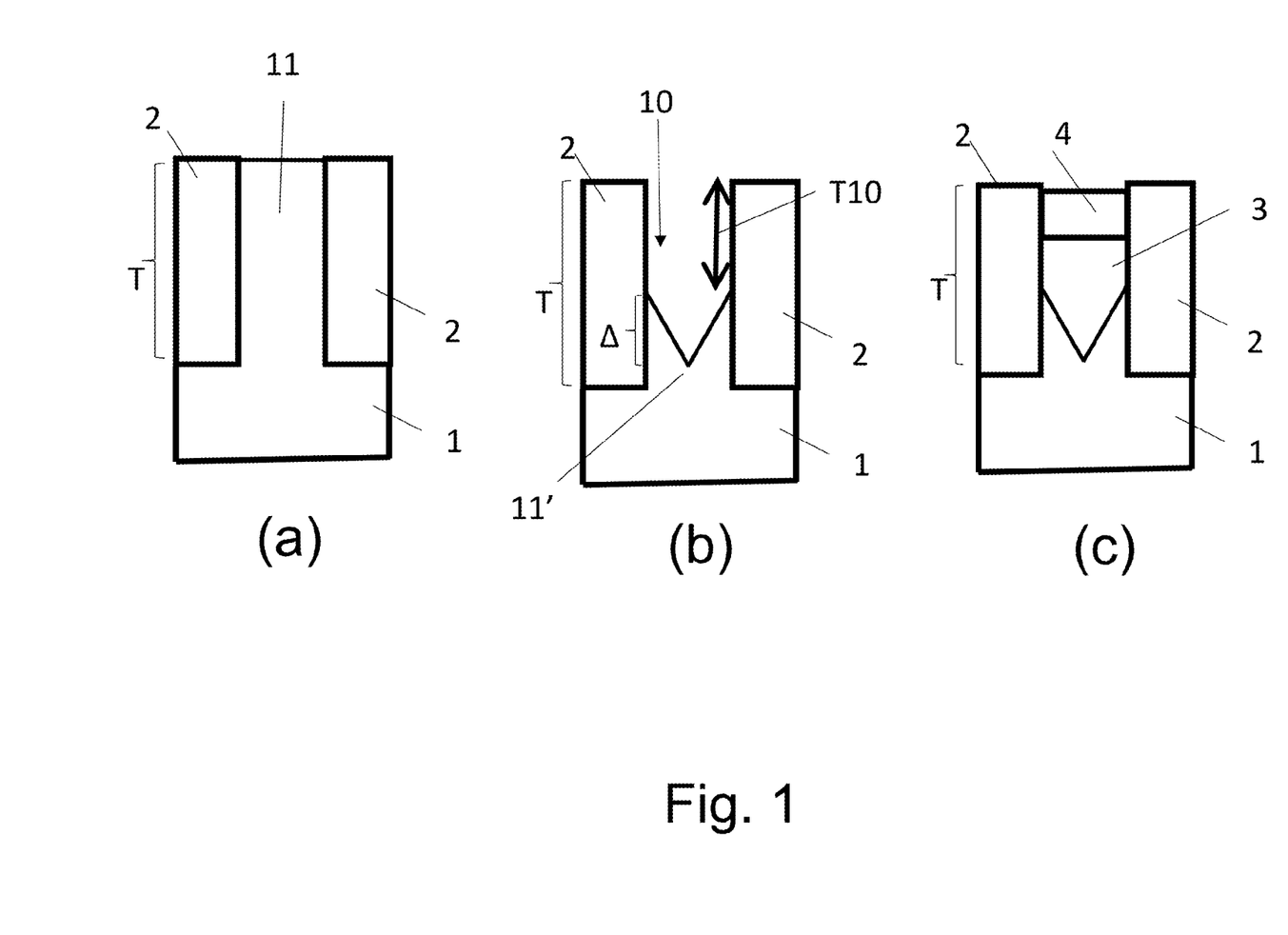
FIG. 1 illustrates a process flow 1(a)-1(c) according to embodiments of the present disclosure.

FIGS. 1(a) to 1(c) illustrates a method for manufacturing a channel of a pMOS transistor device comprising a germanium channel material 4 on a silicon based substrate 1 according to a preferred embodiment of the present disclosure.

The method starts by providing a shallow trench isolation (STI) substrate, which is known to the skilled person. A STI substrate can be manufactured for instance by providing a silicon wafer or substrate 1, and patterning silicon protrusions 11 into the substrate 1, followed by embedding the silicon protrusions 11 in so called shallow trench isolation structures 2, typically comprising a dielectric material as for instance $SiO_2$. The sidewalls of the silicon protrusions 11 are preferably perpendicular to a front surface of the silicon wafer 1, but may form a small angle with respect to the normal thereto, in such a way that the remaining Si protrusions are slightly narrower at the top compared to the bottom.

In the present example, the method comprises
a. providing an shallow trench isolation (STI) substrate (2,1,11) comprising a silicon protrusion 11 embedded in STI dielectric structures 2, the STI structures 2 having an initial thickness T (FIG. 1 (a));

b. partially recessing the silicon protrusion 11 in order to provide a trench 10 in between adjacent STI structures 2, and to provide a V-shaped groove at an upper surface of the recessed protrusion 11' (the trench having a minimal depth T10 and a maximal depth T10+Δ; Δ being the vertical distance between the lowest point of the V-shaped groove and the highest points at a position adjacent to the sidewalls of the trench 10; in other words the distance between the projections of the lowest point and the highest point on a normal direction to the front surface of the substrate/wafer) (FIG. 1(b));

c. growing a $Si_{1-x}Ge_x$ SRB layer 3 in the trenches 10 (FIG. 1(c)); and d. growing a Germanium based channel layer 4 on (e.g. on top of) the $Si_{1-x}Ge_x$ SRB layer 3 (FIG. 1(c)).

In the present example, the $Si_{1-x}Ge_x$ SRB layer 3 comprises a germanium content x being in the range of 20% to 99% (more preferably in the range of 50% to 84%, more preferably in the range of 65% to 75%), and the SRB layer 3 has a thickness smaller than 400 nm (preferably smaller than 120 nm).

The step of partially recessing the silicon protrusion in order to provide a trench in between adjacent STI structures, and to provide a V-shaped groove at an upper surface of the recessed protrusion, is preferably performed such that the highest points (at a position adjacent to the sidewalls of the trench) of the {111} oriented facets remains higher than the lower surface of the STI structures. Indeed, the recess is preferably performed such that undercutting the adjacent STI structures is avoided (such that T10>T).

A fully strained Ge channel FINFET device was produced by a process including the above method, by using a wet-chemical treatment (e.g. applying a tetramethylammonium hydroxide (TMAH) solution, or any other wet etch process which can form a V-shaped groove) for the recessing of the Si recess 11. The process comprised: formation {111} surface "V"-shape groove by TMAH silicon recess in a shallow trench isolation (STI) region; selective epitaxial growth of the $Si_{1-x}Ge_x$ (x=0.7) SRBs, which can be as thin as about 30 nm still having a relaxation degree in the range of 85% to 100%; and continuous growth of 20-30 nm thick Ge channel layer on top of the $Si_{1-x}Ge_x$ (x=0.7) SRBs.

Figure 4:
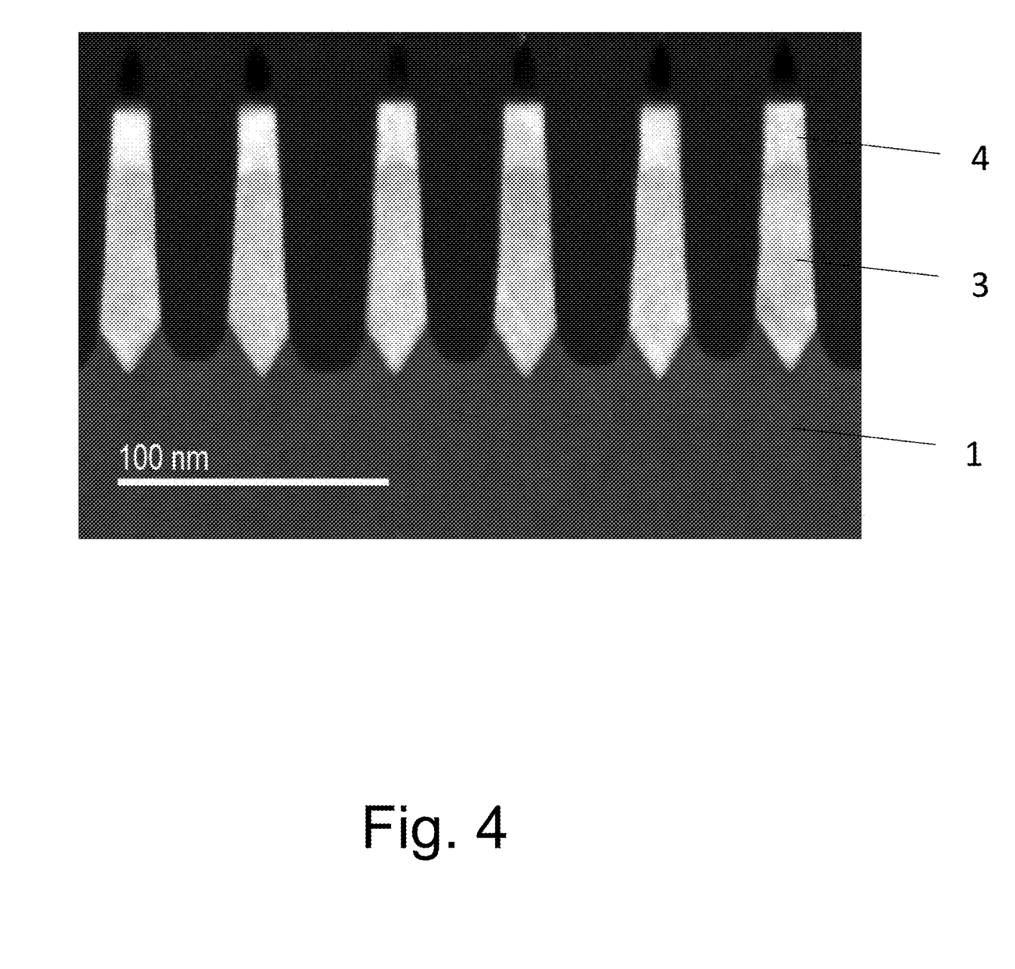
FIG. 4 shows a high angle annular dark field STEM (HAADF-STEM) image showing the about 20 nm thick Ge on top of 55 nm thick $Si_{1-x}Ge_x$ (in the given example x=0.7) SRBs grown in the shallow trenches with a starting {111} Si surface ("V"-shaped groove).
Figure 6:
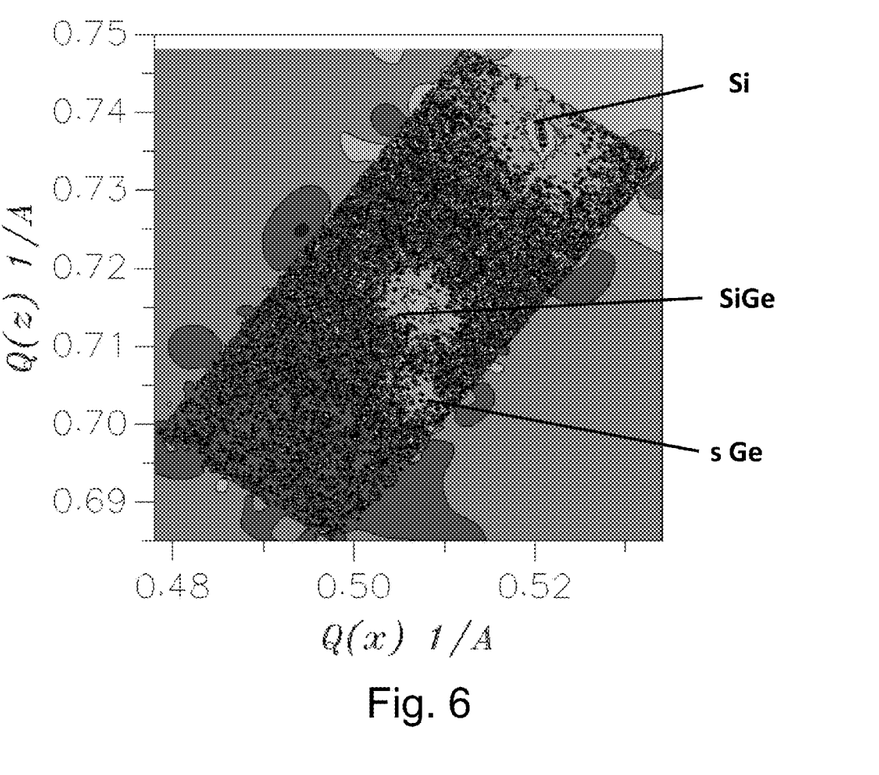
FIG. 6 is an X-Ray Diffraction (XRD) {224} Reciprocal Space Mapping (RSM) image of the about 20 nm thick Ge on top of 55 nm thick $Si_{1-x}Ge_x$ (x=0.7) SRBs, showing fully compressively strained Ge (sGe) on 90% strain relaxed $Si_{0.3}Ge_{0.7}$.

As seen in FIG. 4, the TMAH recess created the {111} facet planes on (100) Si substrate STI regions which is denoted as "V"-shape grooves. With diluted HF (0.7%) pre-cleaning for 20 s and a 600° C. pre-bake in the CVD growth chamber, 55-nm thick $Si_{1-x}Ge_x$ (x=0.7) SRBs were grown selectively in the ~10 nm wide trenches 10 and a 20-30 nm thick Ge channel layer 4 was grown continuously, i.e. without growth interruption, on top of the $Si_{1-x}Ge_x$ (x=0.7) SRBs 3. XRD {224} Reciprocal Space Mapping (RSM) demonstrates that the 55 nm-thick $Si_{1-x}Ge_x$ is 90% relaxed with a Ge content of 71% and the Ge layer is fully compressively strained with respect to the $Si_{0.29}Ge_{0.71}$ SRB, as seen in FIG. 6.

In particular, the formation of facets, e.g., {111} and {311} facets, on top of SiGe SRB has been largely suppressed. As a consequence, the Ge channel growth can end up with a flat surface, if all dimensions are suitable scaled. Most importantly, Ge content of 71% in SiGe SRB is uniform as demonstrated in the HAADF-STEM image of FIG. 4. Finally, a flat smooth surface of the fully strained Ge channel layer was obtained.

Figure 5:
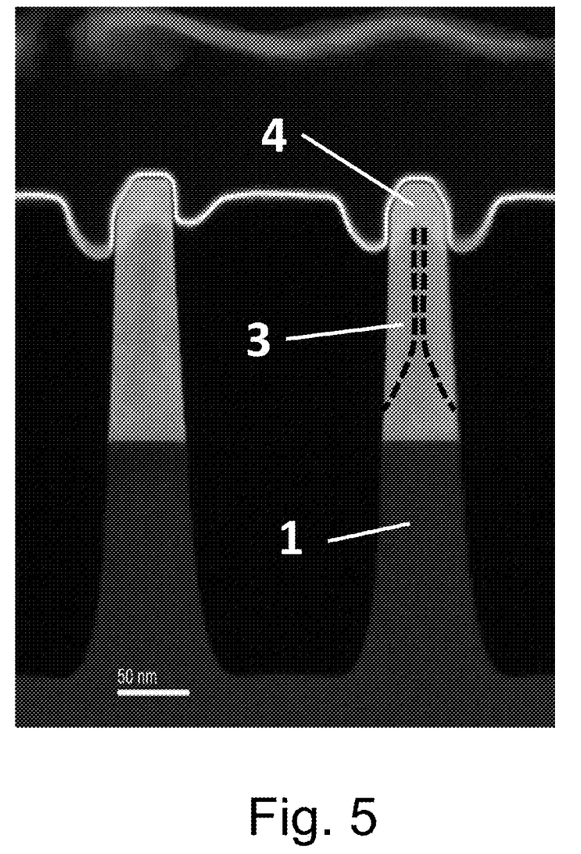
FIG. 5 shows a HAADF-STEM image of a device manufactured by means of a prior art growth process on a flat surface.

To demonstrate the advantage of "V"-shape groove, the structural material properties were compared with the standard approach which consists of Ge and SiGe growth on the "flat" Si (100) plane in the trenches, where the Si recess is done in-situ using suitable HCl vapor etching. It was found that the SiGe SRB layers have a pronounced facet issue which gives rise to a "triangular" shape on the top of SiGe SRBs. As a consequence, SiGe SRB layers exhibit a variation of Ge content as demonstrated from HAADF-STEM (FIG. 5, dotted line). This is a consequence of the formation of {111} facets since Ge incorporation in {111} SiGe is higher than in (100) oriented. Most importantly, such SiGe SRB layers grown on the "flat" {001} surface are typically less (e.g. only about 60%) relaxed.

Figure 3:
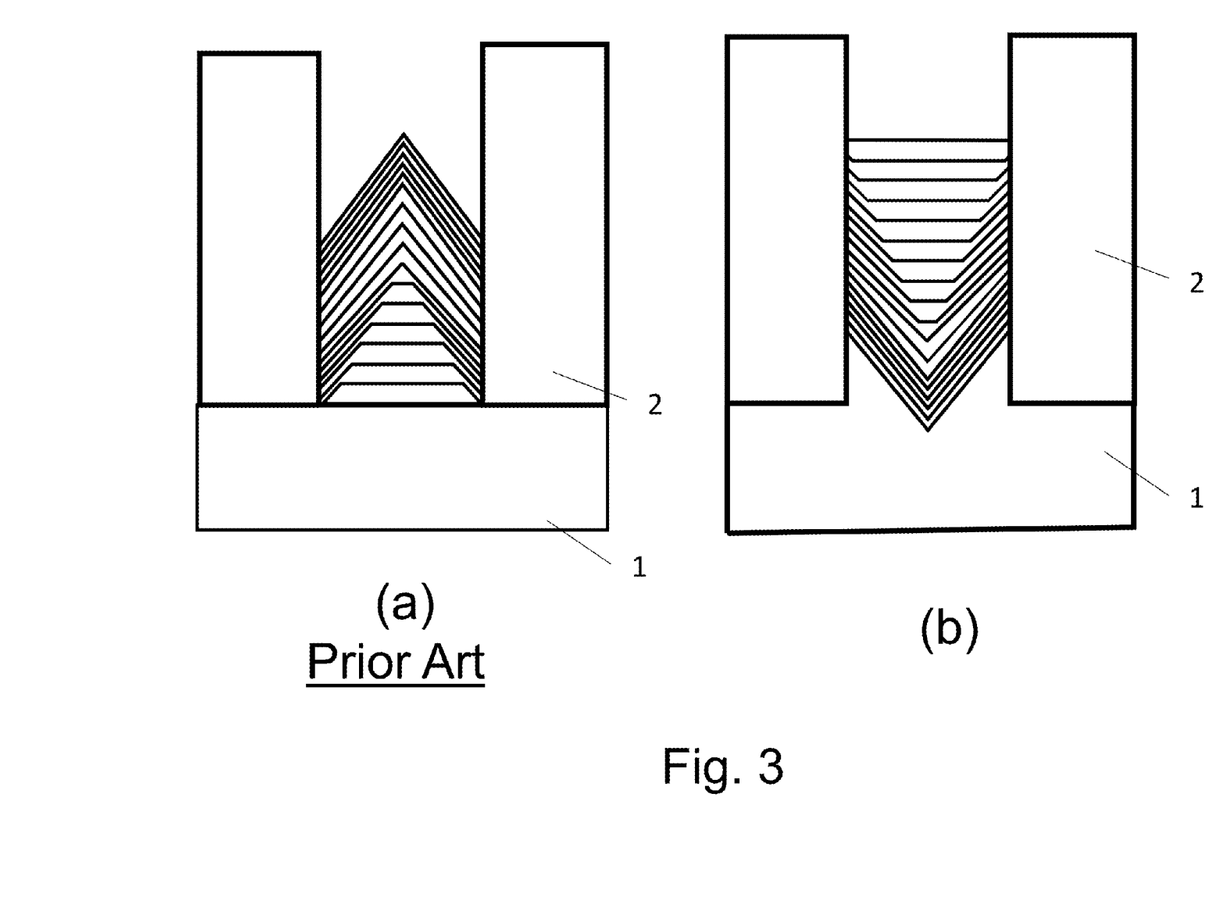
FIG. 3 illustrates the growth process of a SRB layer according to an embodiment of the present disclosure 3(b), along with a prior art growth process on a flat surface 3(a).

FIG. 3 illustrates the different nature of facet growth between embodiments of the present disclosure (b) and embodiments of the above mentioned the standard approach (a). The growth in the trenches from bottom to top provides facets which are systematically becoming larger in case (a). To the contrary, in case (b), these facets become smaller and end up in a flat surface. In FIG. 3, as an example, only one kind of orientation facets is shown. This is not a limitation, and also other orientation facets or a mixture of different orientation facets may be formed.

This comparison clearly demonstrates that the "V"-shape groove method has at least the following potential advantages: the growth of $Si_{1-x}Ge_x$ (x=0.7) SRBs on "V"-shape groove results in a flat surface of SiGe SRB and a flat surface of Ge channel layer; the $Si_{1-x}Ge_x$ (x=0.7) SRBs grown on "V"-shape groove has a more uniform Ge content as demonstrated by TEM; and better control of the surface orientations of the sGe FIN surface, by carefully matching the SiGe thickness and the Si recess depth. By surface orientations, both the {001} top surface as well as the {110} side walls are meant.

By taking advantage of the larger relaxation degree (within the range of 85% to 100%) of SiGe SRBs, the fully strained Ge channel layer has been grown.

In summary, the method described above can be used to fabricate fully compressively strained Ge FINFET on thin (30 nm to about 120 nm) 85%-100% relaxed $Si_{1-x}Ge_x$ (e.g. x=0.7) SRBs, for instance for the application of Ge pMOS at the nodes of 22 nm and below.

Figure 2:
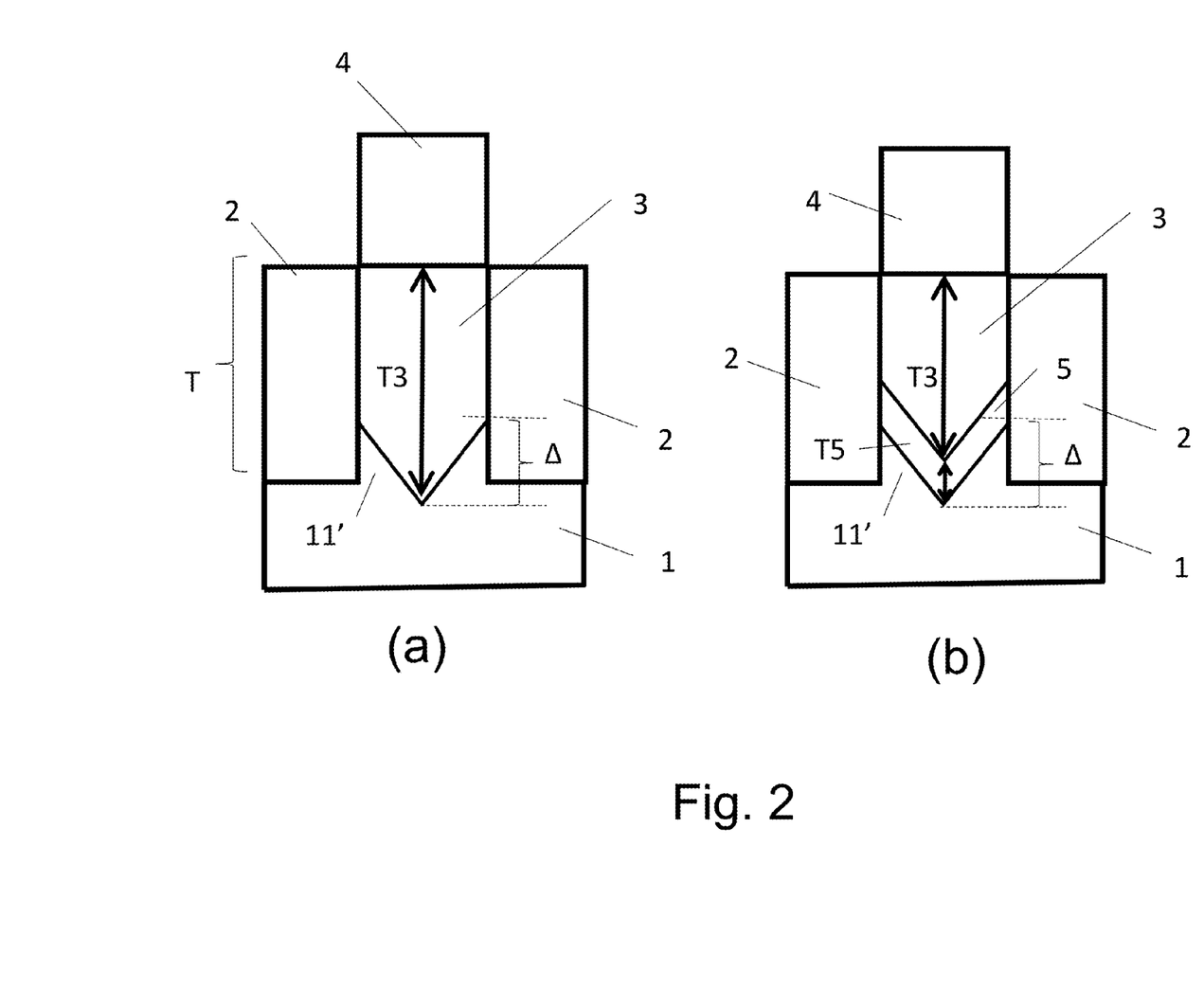
FIG. 2 illustrates embodiments of the present disclosure.
Figure 7:
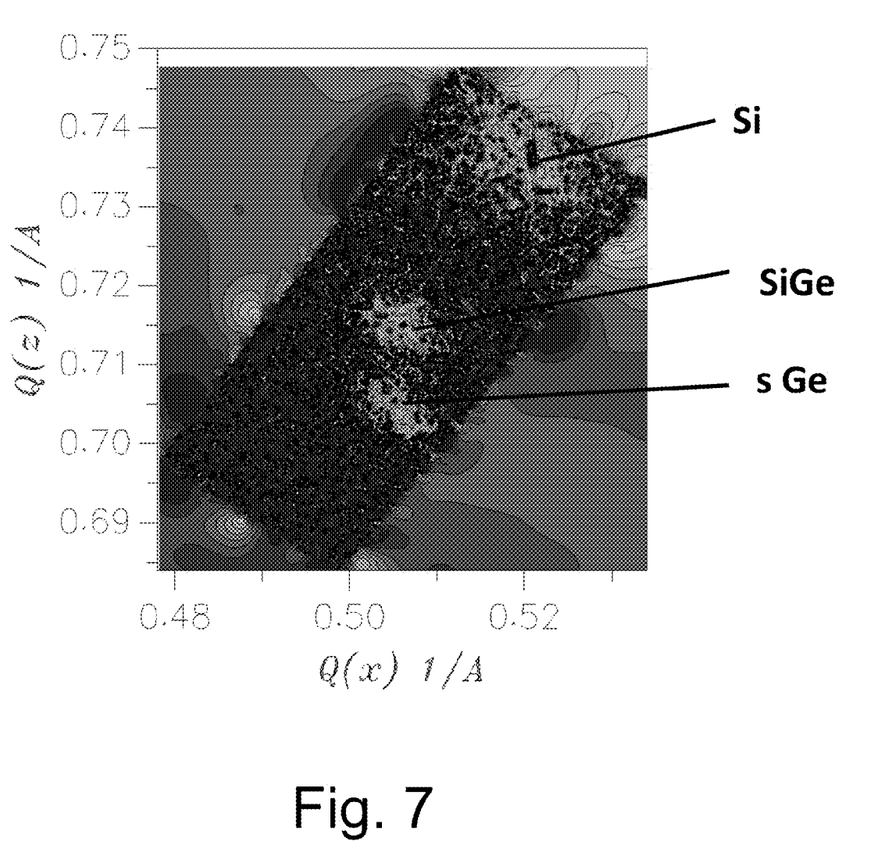
FIG. 7 shows XRD {224} RSM images the about 30 nm thick Ge on top of about 35 nm thick $Si_{1-x}Ge_x$ (x=0.7) grown with an about 5 nm thick Ge seed layer in between the Si substrate and the SiGe SRB, showing 100% strain relaxation in the $Si_{0.3}Ge_{0.7}$ SRB and fully uniaxial strained Ge (SGe) channel (cap) layer in the direction along the FIN (Ge seed layer is too thin to detect by XRD).

According to preferred embodiments, a seed layer 5 can be epitaxially grown on the recessed silicon protrusion 11', and the SRB layer 3 can be epitaxially grown on the seed layer 5. These embodiments allow a further reduction of the SRB thickness, more specifically they allow the use of a smaller combined thickness of seed layer and SRB layer (T5+T3) when compared to a required thickness for a single SRB layer (T5). The resulting device of such a process is illustrated in FIG. 2(b). FIG. 7 shows XRD {224} RSM images of the about 30 nm thick Ge on top of an about 35 nm thick $Si_{1-x}Ge_x$ (x=0.7) grown with an about 5 nm thick Ge seed layer in between the Si substrate and the SiGe SRB, showing 100% strain relaxation in the $Si_{0.3}Ge_{0.7}$ SRB and fully uniaxial strained Ge channel layer in the direction along the FIN (Ge seed layer is too thin to detect by XRD). This shows that the relaxation is relatively increased when a seed layer is added.

Devices manufactured by the above methods are illustrated in relation with FIG. 2(a) (without seed layer 3) and FIG. 2(b) (with seed layer 5). These devices may be intermediate devices, and may for instance result from recessing the STI structures 2 up until a level equal or below the lower level of the channel layer 4 (or the upper level of the SRB layer 3).

FIG. 2(a) illustrates a transistor device comprising a germanium based channel structure 4 on a silicon based substrate 1, the transistor device comprising a layer stack embedded in STI dielectric structures 2 which is underlying the germanium channel structure 4, the layer stack comprising: a recessed silicon protrusion 11' comprising a V-shaped groove at an upper surface thereof; and a $Si_{1-x}Ge_x$ SRB layer 3 above (e.g. on) the recessed silicon protrusion 11'. In this example, the $Si_{1-x}Ge_x$ SRB layer comprises a germanium content x being in the range of 20% to 99% (more preferably in the range of 50% to 84%, more preferably in the range of 65% to 75%), and the SRB layer 3 has a thickness smaller than 400 nm, for instance smaller than 120 nm.

FIG. 2(*b*) illustrates another preferred embodiment, in which the layer stack further comprises a seed layer 5, preferably a germanium seed layer 5, in between, preferably directly in between (i.e. there are no other layers in between), the upper surface of the recessed protrusion 11' and the $Si_{1-x}Ge_x$ SRB layer 3.

Preferably, the sidewalls and upper surface of the channel layer 4 can be provided/covered with a gate layer or layer stack, as well as source/drain contacts (not depicted).

In both preferred embodiments, the silicon substrate 1 is a (100) oriented substrate, and the V-shaped groove at an upper surface of the recessed protrusion 11' is defined by {111} oriented facets.

In both preferred embodiments, the highest points of the {111} oriented facets is preferably higher than the lower surface of the STI structures. Thus, preferably, the {111} oriented facets do not undercut the adjacent STI structures 2.

In preferred embodiments, the SRB layer 3 has a relaxation degree of in between 85% to 100% and the germanium based channel structure 4 is fully compressively strained with respect to the SRB layer 3.

It is further to be noted that the combination of a V-shaped groove in which a seed layer and a SiGe SRB layer are grown, is less advantageous when the trench in which is grown is too wide. This is illustrated in FIGS. 8(*a*) and 8(*b*).

Indeed, in relatively wide trenches, the silicon recess step results in a much deeper V-groove. This is because the etching in the (001) direction is faster than in the (111) direction. During Si recessing, (111) facets, which are etched more slowly, are formed at the edge of the trench. The width of these facets increases as etching proceeds. Depending on the trench width, the facets grow towards each other and the (001) surface located in between these (111) facets disappears. As long as the (001) surface has not disappeared, Si recess proceeds faster in the middle of the trench. This explains the deeper Si recess for wider trenches (FIG. 8(*b*)) when compared to relatively narrow trenches (FIG. 8(*a*)), because the merging of (111) facets occurs at a later stage.

Figure 8:
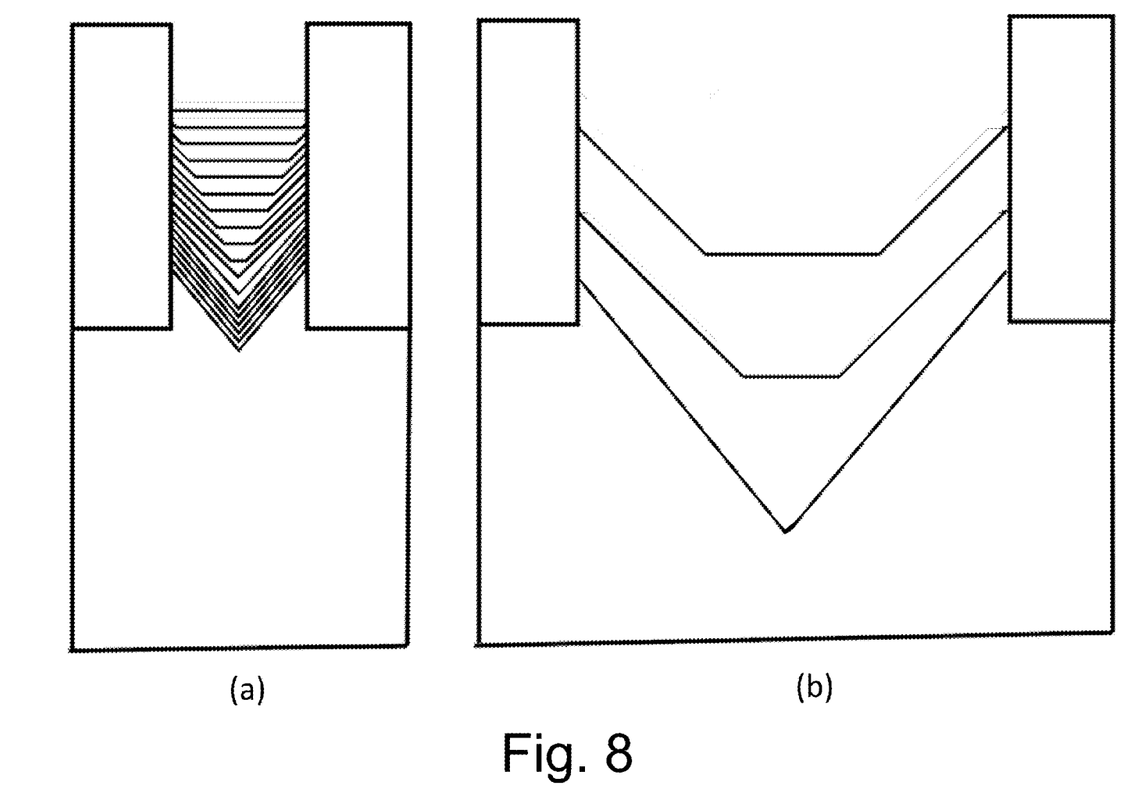
FIG. 8 illustrates the effects of growing in relatively narrow 8(a) versus relatively wide trenches 8(b).

During epitaxial regrowth of the SiGe SRB (also called virtual substrate) and the Ge channel on top (and optionally the Ge seed layer underneath the SiGe), the growth mode is very similar for wide (FIG. 8(*a*)) and narrow (FIG. 8(*b*)) trenches. It is well known that the deposition rate is lower on (111) surfaces when compared to growth on (001) surfaces. As a result a (001) surface is generated at the bottom of the trench and this (001) surface widens during growth at the cost of the (111) surfaces. However, the thicknesses of the regrown layers will be identical as long as the (111) facets are not fully consumed. For a predetermined thickness of the regrown layer, the growth in trenches with large widths results in a non-flat top surface as schematically shown in FIG. 8(*b*) and in a misalignment of the (001) surface at the center of the trench, this misalignment being a function of the trench width. This means that for wide trenches, the strained Ge (sGe) fin surface cannot be very well controlled by carefully matching the SiGe SRB thickness and the Si recess depth, at least not for the preferred, reduced SiGe SRB thicknesses.

In addition, the observed improvement in material composition (as set out in relation with FIG. 4 and associated description) is expected to be lost for wider trenches.

Figure 9:
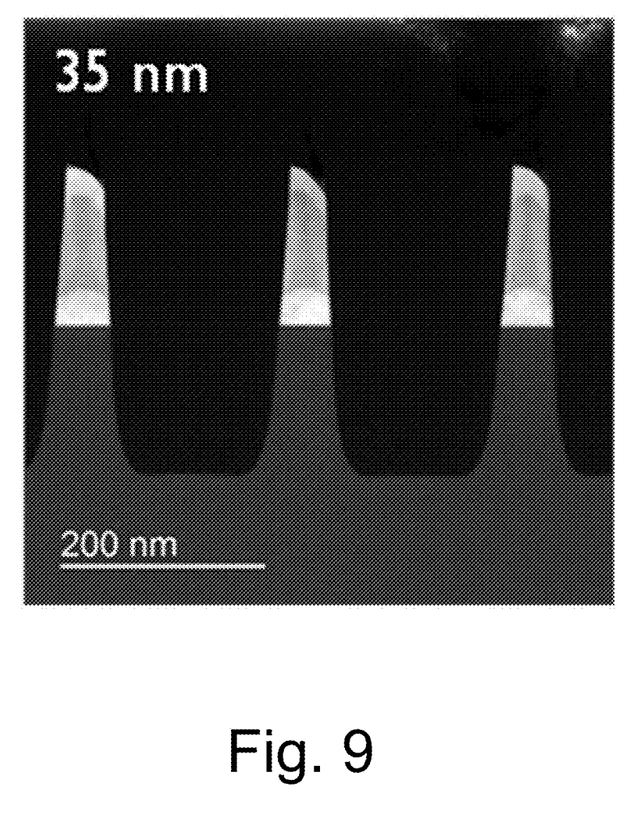
FIG. 9 illustrates a High Angle Annular Dark Field Scanning Transmission Electron Microscopy (HAADF-STEM) image of a device manufactured by means of a prior art growth process on a flat silicon surface, whereby also a seed layer was on the flat surface before growing the SiGe SRB layer.

One potential advantage of aspects of the present disclosure is that the $Si_{1-x}Ge_x$ SRB grown on a "V"-shape groove has a more uniform Ge content distribution. This has been demonstrated by TEM imaging, and results in a reduced strain variation throughout the SRB layer, and a more optimal stress built up in the germanium based/germanium channel layer. It is to be noted that if a flat Si surface is created by the recess process, on top of which the SRB layer is grown, this non-uniformity occurs, in cases both with or without a Ge seed layer underneath the SiGe SRB layer. This is illustrated in FIG. 9, which shows an STI patterned Si wafer. The Si has been recessed by HCl vapor etching. On top of the recessed surface a Ge seed layer is epitaxially grown followed by the epitaxial growth of a SiGe SRB and the Ge-cap layer, the latter one acting as the channel of the pMOS device. The non-uniformity in Ge content caused by facet formation during the growth is very much the same as seen for SiGe-SRB growth on a flat Si surface without seed layer.

The foregoing description details certain embodiments of the disclosure. It will be appreciated, however, that no matter how detailed the foregoing appears in text, the disclosure may be practiced in many ways.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

The invention claimed is:

1. A method for manufacturing a transistor device comprising a germanium channel material on a silicon substrate, wherein the silicon substrate is a (100) oriented substrate, the method comprising:
   providing an shallow trench isolation (STI) substrate comprising a silicon protrusion embedded in STI dielectric structures;
   partially recessing the silicon protrusion in order to provide a trench in between adjacent STI structures, and to provide a V-shaped groove at an upper surface of the recessed protrusion, wherein the V-shaped groove at an upper surface of the recessed protrusion is defined by {111} oriented facets;
   growing a $Si_{1-x}Ge_x$ strain relaxed buffer (SRB) layer in the trench; and
   growing a Germanium based channel layer on the $Si_{1-x}Ge_x$ SRB layer,
   wherein the $Si_{1-x}Ge_x$ SRB layer comprises a germanium content x that is within the range of 20% to 99%, and wherein the SRB layer has a thickness less than 400 nm.

2. The method according to claim 1, wherein growing the $Si_{1-x}Ge_x$ SRB layer in the trench comprises epitaxially growing the $Si_{1-x}Ge_x$ SRB layer on the upper surface.

3. The method according to claim 1, further comprising epitaxially growing a germanium seed layer on the upper surface, and wherein growing the $Si_{1-x}Ge_x$ SRB layer in the trench comprises epitaxially growing the $Si_{1-x}Ge_x$ SRB layer on the seed layer.

4. The method according to claim 1, wherein the Germanium based channel layer has a thickness greater than 10 nm.

5. The method according to claim 3, wherein growing the $Si_{1-x}Ge_x$ SRB layer in the trench, growing the Germanium based channel layer on the $Si_{1-x}Ge_x$ SRB layer, and growing the seed layer are performed in a continuous, uninterrupted process.

6. The method according to claim 1, wherein the trench has a width less than 20 nm.

7. The method according to claim 1, wherein the STI thickness is less than 400 nm.

8. The method according to claim 1, wherein partially recessing the silicon protrusion in order to provide a trench in between adjacent STI structures, and to provide a V-shaped groove at an upper surface of the recessed protrusion, comprises performing wet etching the protrusions.

9. The method according to claim 1, wherein partially recessing the silicon protrusion in order to provide a trench in between adjacent STI structures, and to provide a V-shaped groove at an upper surface of the recessed protrusion, is performed such that a highest point of the {111} oriented facets remains higher than a lowest surface of the STI structures.

10. A transistor device comprising a germanium based channel structure on a silicon based substrate, wherein the silicon based substrate is a (100) oriented substrate, the transistor device comprising:
   a layer stack embedded in shallow trench isolation (STI) dielectric structures, the layer stack comprising:
      a recessed silicon protrusion comprising a trench in between adjacent STI structures, and a V-shaped groove at an upper surface of the recessed protrusion, wherein the V-shaped groove at an upper surface of the recessed protrusion is defined by {111} oriented facets; and
      a $Si_{1-x}Ge_x$ strain relaxed buffer (SRB) layer in the trench above the recessed silicon protrusion; and
   a germanium based channel structure on the $Si_{1-x}Ge_x$ SRB layer,
   wherein the $Si_{1-x}Ge_x$ SRB layer comprises a germanium content x that is within the range of 20% to 99%, and wherein the SRB layer has a thickness less than 400 nm.

11. The transistor device according to claim 10, further comprising a germanium based seed layer in between the upper surface and the $Si_{1-x}Ge_x$ SRB layer.

12. The transistor device according to claim 10, wherein a highest point of the {111} oriented facets is higher than a lowest surface of the STI structures.

13. The transistor device according to claim 10, wherein the SRB layer has a relaxation degree within the range of 85% to 100%, and wherein the germanium based channel structure is fully compressively strained with respect to the SRB layer.

* * * * *